(12) United States Patent
Huang et al.

(10) Patent No.: US 9,768,408 B2
(45) Date of Patent: Sep. 19, 2017

(54) ORGANIC LIGHT EMITTING DIODE DISPLAY HAVING POROUS FRIT LAYER AND MANUFACTURING METHOD THEREOF

(71) Applicant: Innolux Corporation, Miao-Li County (TW)

(72) Inventors: Hao-Jung Huang, Miao-Li County (TW); Kuang-Pin Chao, Miao-Li County (TW); Yang-Chen Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 96 days.

(21) Appl. No.: 14/722,325

(22) Filed: May 27, 2015

(65) Prior Publication Data
US 2015/0255747 A1    Sep. 10, 2015

Related U.S. Application Data

(63) Continuation of application No. 14/048,128, filed on Oct. 8, 2013, now Pat. No. 9,076,987.

(30) Foreign Application Priority Data
Oct. 17, 2012  (CN) .......................... 2012 1 0394909

(51) Int. Cl.
*H01L 51/52* (2006.01)
*H01L 27/32* (2006.01)
*H01L 51/56* (2006.01)

(52) U.S. Cl.
CPC .......... *H01L 51/5246* (2013.01); *H01L 27/32* (2013.01); *H01L 27/3276* (2013.01);
(Continued)

(58) Field of Classification Search
CPC combination set(s) only.
See application file for complete search history.

(56) References Cited

U.S. PATENT DOCUMENTS 8,110,982 B2    2/2012  Kwon et al.
2008/0106194 A1*  5/2008  Logunov ................ B32B 17/06
                                                              313/512
(Continued)

OTHER PUBLICATIONS

Partial EP Search report dated Jan. 30, 2014.

*Primary Examiner* — Robert Huber
*Assistant Examiner* — J. R. Oakley
(74) *Attorney, Agent, or Firm* — McClure, Qualey & Rodack, LLP

(57) ABSTRACT

An organic light emitting diode display and a manufacturing method thereof are provided. The organic light emitting diode display includes a first substrate, a second substrate, a plurality of organic light emitting diodes, and a frit layer. The organic light emitting diodes are disposed on the first substrate, and the frit layer adheres the first substrate and the second substrate to each other. The frit layer includes a first porous region having pores, a second porous region having pores, and a third porous region having pores. The number of the pores of the first porous region with a diameter of larger than or equal to 4 μm and smaller than or equal to 15 μm is greater than the number of the pores of the second porous region with the above-mentioned diameter range.

18 Claims, 5 Drawing Sheets

(52) U.S. Cl.
CPC ...... *H01L 27/3288* (2013.01); *H01L 51/5253* (2013.01); *H01L 51/56* (2013.01)

(56) References Cited

U.S. PATENT DOCUMENTS

| | | | |
|---|---|---|---|
| 2008/0206925 A1* | 8/2008 | Chatterjee | H01L 51/5253 438/106 |
| 2009/0308105 A1 | 12/2009 | Pastel et al. | |
| 2010/0044730 A1 | 2/2010 | Kwon et al. | |
| 2012/0287026 A1 | 11/2012 | Masuda | |

* cited by examiner

US 9,768,408 B2

ORGANIC LIGHT EMITTING DIODE DISPLAY HAVING POROUS FRIT LAYER AND MANUFACTURING METHOD THEREOF

This application is a continuation application of U.S. application Ser. No. 14/048,128, filed on Oct. 8, 2013, now U.S. Pat. No. 9,076,987, which claims the benefit of People's Republic of China application Serial No. 201210394909.0, filed Oct. 17, 2012, the subject matter of which is incorporated herein by reference.

BACKGROUND

Technical Field

The invention relates in general to an organic light emitting diode display and a manufacturing method thereof, and particularly to an organic light emitting diode display comprising a frit layer having a porous structure and a manufacturing method thereof.

Description of the Related Art

Along with the advances of display technology, various types of display devices have been developed. Organic light emitting diode displays have become one of the most important research targets of display technology, and the requirements to the functions and characteristics of organic light emitting diode displays have gradually increased as well. However, organic light emitting diodes are very sensitive to moisture, and hence the performance and the service life thereof are easily influenced by external moisture. Therefore, researchers have been working on providing an organic light emitting diode display with excellent moisture-resisting abilities.

SUMMARY

The invention relates to an organic light emitting diode display and a manufacturing method thereof. In the organic light emitting diode display, with the "loose-dense-loose" structure formed from the first and the third porous regions having large pores and the second porous region having small pores and located between the first and the third porous regions, both moisture resistance and strain releasing can be achieved at the same time.

According to an embodiment of the present invention, an organic light emitting diode display is provided. The organic light emitting diode display comprises a first substrate, a second substrate, and a frit layer. The first substrate has a displaying area. The frit layer adheres the first substrate and the second substrate to each other. The frit layer comprises a first porous region and a second porous region disposed adjacent to the first porous region. The first porous region is disposed on the displaying area and located between the second porous region and the displaying area. The first porous region has a plurality of first pores with a diameter of larger than or equal to 4 µm and smaller than or equal to 15 µm. The number of the first pores with the diameter of larger than or equal to 4 µm and smaller than or equal to 15 µm is greater than the number of the pores of the second porous region with the diameter of larger than or equal to 4 µm and smaller than or equal to 15 µm.

According to another embodiment of the present invention, a manufacturing method of an organic light emitting diode display is provided. The manufacturing method of the organic light emitting diode display comprises the following steps: a first substrate having a displaying area and a second substrate are provided; a plurality of organic light emitting diodes are disposed on the first substrate; and a frit layer is formed for adhering the first substrate and the second substrate to each other. Forming the frit layer includes the following steps: a first porous region having a plurality of first pores with a diameter of larger than or equal to 4 µm and smaller than or equal to 15 µm is formed; and a second porous region is formed adjacent to the first porous region. The number of the first pores with the diameter of larger than or equal to 4 µm and smaller than or equal to 15 µm is greater than the number of the pores of the second porous region with the diameter of larger than or equal to 4 µm and smaller than or equal to 15 µm.

The above and other aspects of the disclosure will become better understood with regard to the following detailed description of the non-limiting embodiment(s). The following description is made with reference to the accompanying drawings.

DETAILED DESCRIPTION

In the embodiments of the present disclosure, an organic light emitting diode display and a manufacturing method thereof are provided. In the organic light emitting diode display, with the "loose-dense-loose" structure formed from the first and the third porous regions having large pores and the second porous region having small pores and located between the first and the third porous regions, both moisture resistance and strain releasing can be achieved at the same time. The following embodiments are for the purpose of elaboration only, not for limiting the scope of protection of the invention. Detailed structures and processes may be modified or changed by one skilled in the art after having the benefit of this description of the disclosure.

Figure 1A:
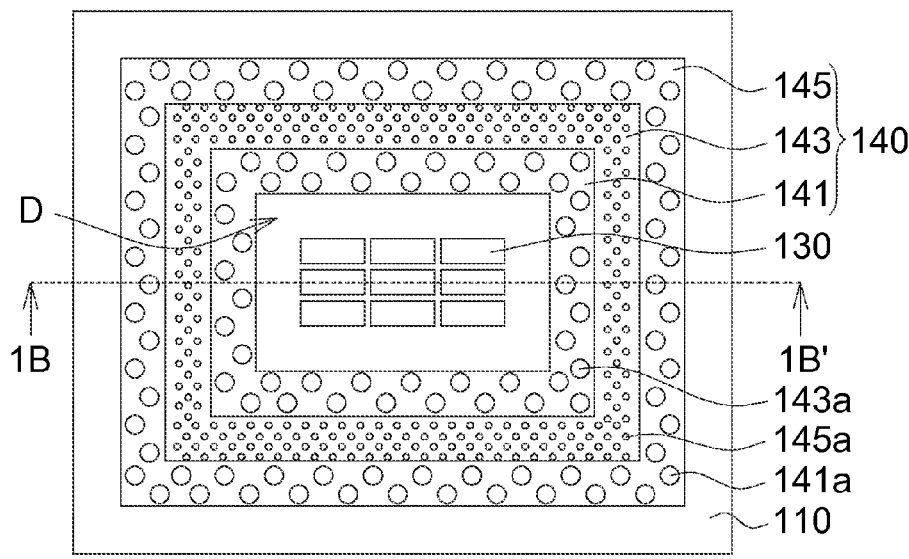
FIG. 1A shows a top view of an organic light emitting diode display according to an embodiment of the present invention.
Figure 1B:
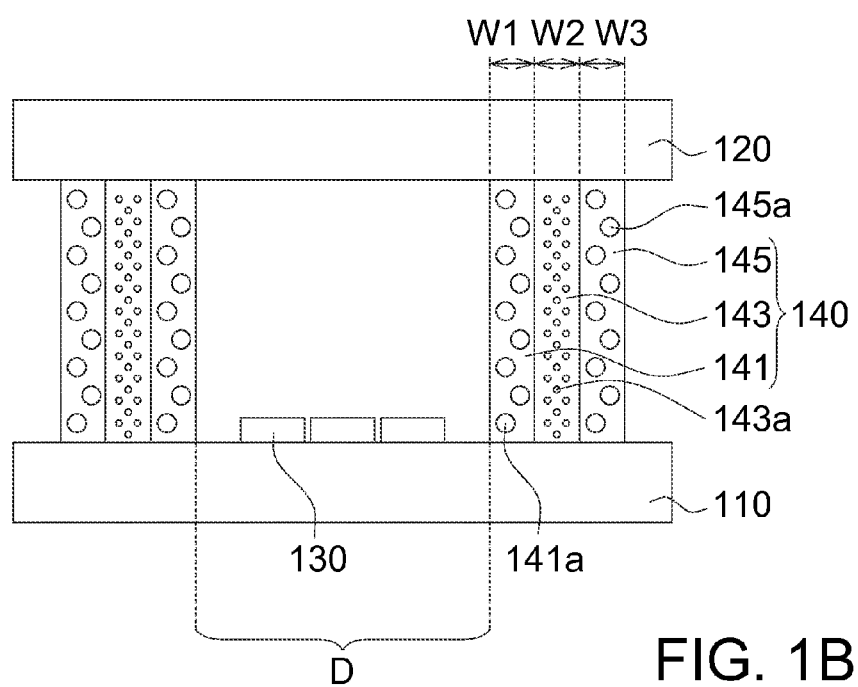
FIG. 1B shows a cross-sectional view along the section line 1B-1B' in FIG. 1A.

FIG. 1A shows a top view of an organic light emitting diode display according to an embodiment of the present invention, and FIG. 1B shows a cross-sectional view along the section line 1B-1B' in FIG. 1A. Referring to FIGS. 1A-1B, the organic light emitting diode display 100 includes a first substrate 110, a second substrate 120, one or more than one organic light emitting diode 130, and a frit layer 140. The first substrate 110 has a displaying area D. The organic light emitting diode 130 is disposed on the first substrate 110. The frit layer 140 adheres the first substrate 110 and the second substrate 120 to each other. The frit layer 140 includes a first porous region 141, a second porous region 143, and a third porous region 145. The first porous region 141 is disposed adjacent to the displaying area D, and the first porous region 141 is disposed between the second porous region 143 and the displaying area D. The first porous region 141 has a plurality of first pores 141a with a diameter of larger than or equal to 4 µm and smaller than or equal to 15 µm. The second porous region 143 has a plurality of second pores 143a with a diameter of larger than or equal to 0.2 µm and smaller than or equal to 4 µm. The third porous region 145 is located on an outermost side of the frit layer 140, and the second porous region 143 is located between the first porous region 141 and the third porous region 145. The third porous region 145 has a plurality of third pores 145a with the diameter of larger than or equal to 4 µm and smaller than or equal to 15 µm.

As shown in FIGS. 1A-1B, the frit layer 140 is formed between the first substrate 110 and the second substrate 120 and surrounding the organic light emitting diodes 130. In the embodiment, the material of the frit layer 140 comprises, for example, a silicon-containing material with excellent moisture resistance properties. The first substrate 110 and the second substrate 120 are such as glass substrates. Similar to the frit layer 140, the first substrate 110 and the second substrate 120 comprise a silicon-containing material. Such homogeneity of materials provides excellent moisture resistance properties of the whole structure after the substrates 110, 120 and the frit layer 140 are adhered to each other. However, the material selections of the first substrate 110, the second substrate 120, and the frit layer 140 are depending on the conditions applied and are not limited to the materials aforementioned.

The material of the frit layer 140 includes a silicon-containing material, which provides excellent moisture resistance. However, after the frit layer 140 is heated to be adhered to glass substrates (e.g. the first substrate 110 and the second substrate 120), it may deform or even crack under the strain. Once the frit layer 140 is deformed or cracked, the moisture resistance of the whole structure is largely reduced. In the embodiment, the first porous region 141 and the third porous region 145 are located on the two sides of the second porous region 143, and the number of the pores 141a and 145a, which have diameters of larger than or equal to 4 µm and smaller than or equal to 15 µm, of the first porous region 141 and the third porous region 145 is greater than the number of the pores with the above-mentioned diameter range (4-15 µm) of the second porous region 143. In addition, the number of the pores, which have diameters of larger than or equal to 0.2 µm and smaller than or equal to 4 µm, of the second porous region 143 is larger than the pores with the above-mentioned diameter range (0.2-4 µm) of the first porous region 141 and the third porous region 145. As such, the pores with large diameters of the first porous region 141 and the third porous region 145 may release the strain effectively, reducing the deformation and cracking of the whole structure under strain. In other words, the first porous region 141 and the third porous region 145, having large pores, located on two sides may be regarded as loose springs, and the second porous region 143, having small pores, located in the middle may be regarded as a tight spring. Accordingly, the frit layer 140 as a whole has a "loose-dense-loose" structure and is provided with a better strain releasing effect, compared to a conventional spring structure with single tension condition.

The porous structure of the frit layer 140 can release the strain effectively and reduce the deformation and cracking when the whole structure is under strain. However, too many pores make the whole structure less dense to an unacceptable level, resulting in decreasing the strain releasing effect, while too few pores make the strain releasing effect decrease. In the embodiment, the number of the pores with diameters of larger than or equal to 4 µm and smaller than or equal to 15 µm of the first porous region 141 and the third porous region 145 is greater than the number of the pores with the above-mentioned diameter range (4-15 µm) of the second porous region 143, and the number of the pores with diameters of larger than or equal to 0.2 µm and smaller than or equal to 4 µm of the second porous region 143 is greater than the pores with the above-mentioned diameter range (0.2-4 µm) of the first porous region 141 and the third porous region 145. As such, the small pores of the second porous region 143 provide a dense structure of the second porous region 143, and thus excellent moisture resistance is maintained. In other words, the "loose-dense-loose" structure formed from the first porous region 141, the second porous region 143, and the third porous region 145 can achieve excellent moisture resistance t while the strain is effectively released at the same time.

As shown in FIG. 1B, in a cross-section of the frit layer 140 along the section line 1B-1B', the first porous region 141 has a width W1, the second porous region 143 has a width W2, and the third porous region 145 has a width W3. In an embodiment, a ratio of the width W2 of the second porous region 143 to the width (W1+W2+E3) of the frit layer 140 is, for example, 10-90%. In an alternative embodiment, the ratio of the width W2 of the second porous region 143 to the width (W1+W2+E3) of the frit layer 140 is, for example, 25-35%, resulting in a better strain releasing effect.

In the embodiment, as shown in FIG. 1A, the third porous region 145 surrounds the second porous region 143, the second porous region 143 surrounds the first porous region 141, and the first porous region 141 surrounds the organic light emitting diodes 130.

In the embodiment, the frit layer 140 surrounding the organic light emitting diodes 130 has, for example, a square hollow structure, and the corner portion of such square hollow structure has a greater density of pores. Since the corner portion is usually under a larger strain, with a greater density of pores, the strain releasing ability of the corner portion is hence improved.

In the embodiment, as shown in FIG. 1B, the first porous region 141, the second porous region 143, and the third porous region 143 abut against the first substrate 110 and the second substrate 120.

Figure 2A:
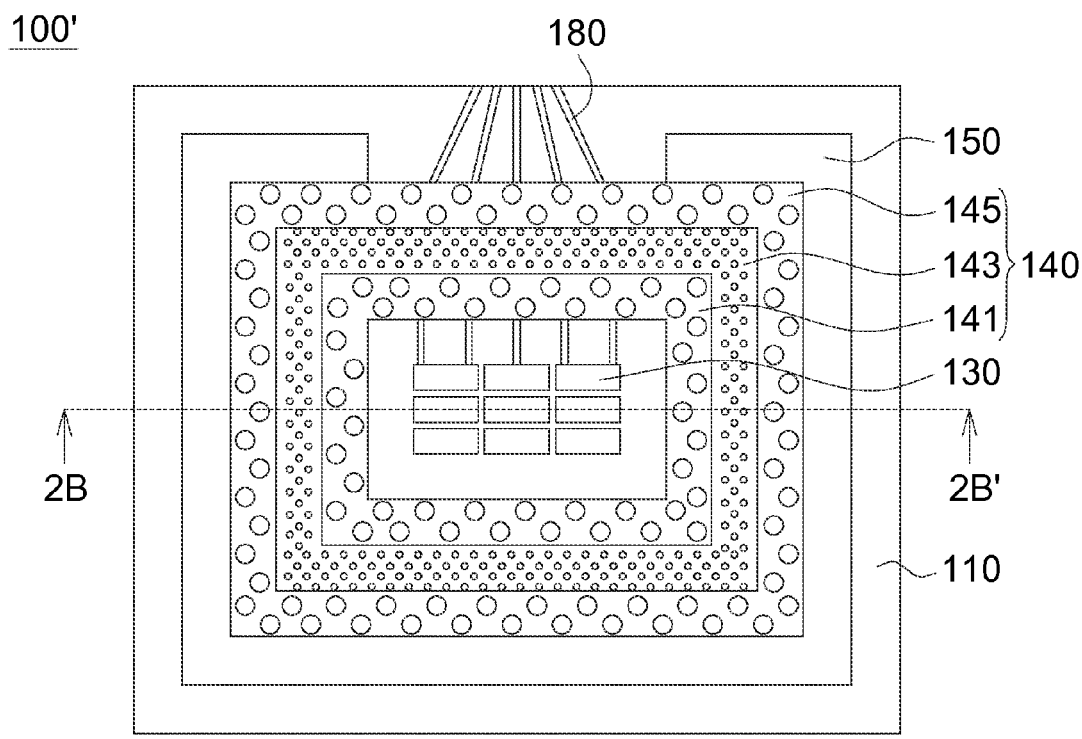
FIG. 2A shows a top view of an organic light emitting diode display according to another embodiment of the present invention.
Figure 2B:
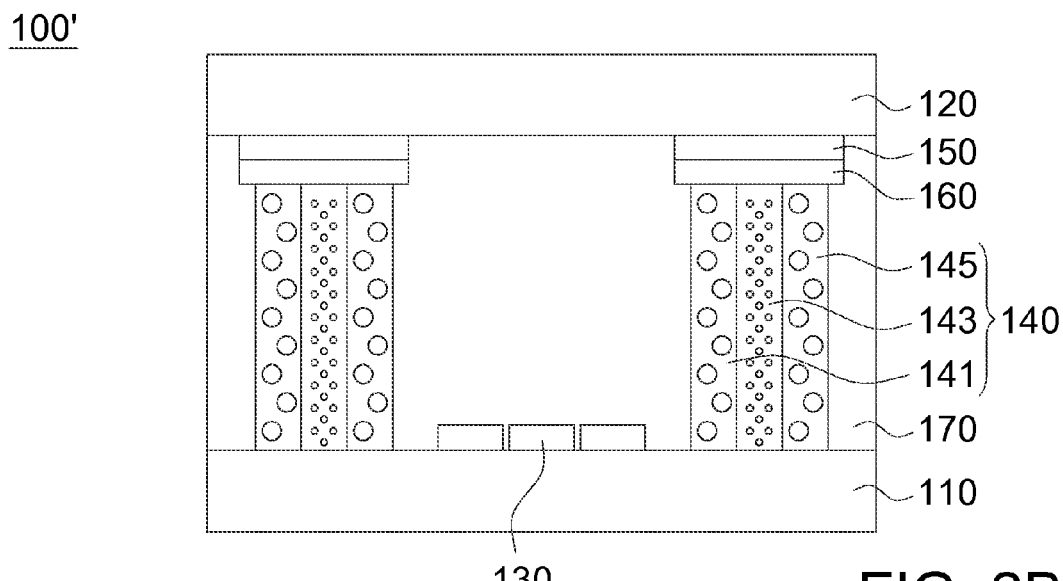
FIG. 2B shows a cross-sectional view along the section line 2B-2B' in FIG. 2A.

FIG. 2A shows a top view of an organic light emitting diode display according to another embodiment of the present invention, and FIG. 2B shows a cross-sectional view along the section line 2B-2B' in FIG. 2A. Referring to FIGS. 2A-2B, the organic light emitting diode display 100' includes the first substrate 110, the second substrate 120, one or more than one organic light emitting diode 130, and the frit layer 140. The structures, arrangements, and function theories of the above-mentioned elements are similar to those with the same labeling in FIGS. 1A-1B and are not repeated there. The differences of the present embodiment from the previous embodiment are described below.

As shown in FIGS. 2A-2B, in the embodiment, the organic light emitting diode display 100' may include a metal layer 150 and a fan out wire structure 180. The fan out wire structure 180 and the metal layer are disposed between the frit layer 140 and the second substrate 120. The fan out wire structure 180 is electrically connected to the organic light emitting diodes 130. The metal layer 150 is electrically isolated from other electronic components. As shown in FIG. 2A, the fan out wire structure 180 is located below a portion of the frit layer 140, while the metal layer 150 is located below the left portion of the frit layer 140.

In a manufacturing process for adhering the first substrate 110 and the second substrate 120 with the frit layer 140 by heating by a laser beam, the fan out wire structure 180 below the frit layer 140 reflects the laser beam, such that the heating efficiency of the portion of the frit layer 140 located above the fan out wire structure 180 is higher than the left portion of the frit layer 140. In the embodiment, the metal layer 150 is disposed below the left portion of the frit layer 140 where the fan out wire structure is not disposed. As such, the whole area below the whole frit layer 140 is disposed with metal (including the fan out wire structure 180 and the metal layer 150), such that the heating efficiency of the whole frit layer 140 in the heating process by the laser beam is uniform.

As shown in FIGS. 2A-2B, in the embodiment, the organic light emitting diode display 100' may include a metal nitride layer 160 disposed between the frit layer 140 and the metal layer 150. The metal nitride layer 160 can increase the adhesion between the frit layer 140 and the metal layer 150.

As shown in FIG. 2B, in the embodiment, the organic light emitting diode display 100' may further include an encapsulation layer 170 disposed between the first substrate 110 and the second substrate 120. The encapsulation layer 170 surrounds and covers the frit layer 140. The encapsulation layer 170 can increase the moisture resistance of the whole device.

The embodiments disclosed below are for elaborating a manufacturing method of an organic light emitting diode display according to an embodiment of the invention. However, the descriptions disclosed in the embodiments of the disclosure such as detailed manufacturing procedures are for illustration only, not for limiting the scope of protection of the disclosure. Referring to FIGS. 3A-3E, which illustrate a process for manufacturing an organic light emitting diode display according to an embodiment of the invention.

Figure 3A:
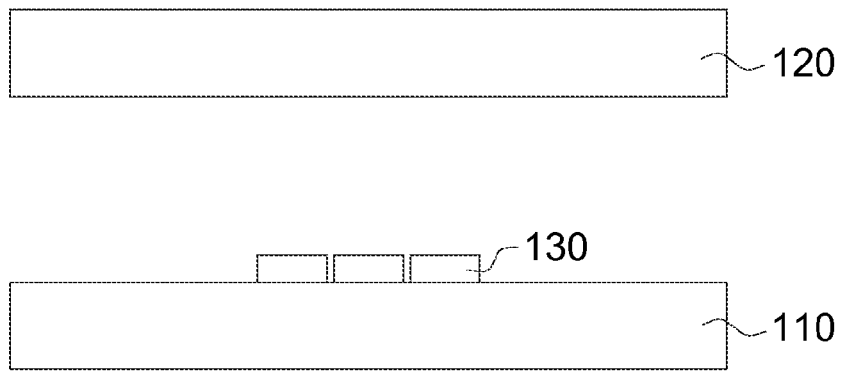
FIGS. 3A-3E illustrate a process for manufacturing an organic light emitting diode display according to an embodiment of the present invention.

Referring to FIG. 3A, the first substrate 110 and the second substrate 120 are provided, and one or more than one organic light emitting diode 130 is disposed on the first substrate 110.

Figure 3B:
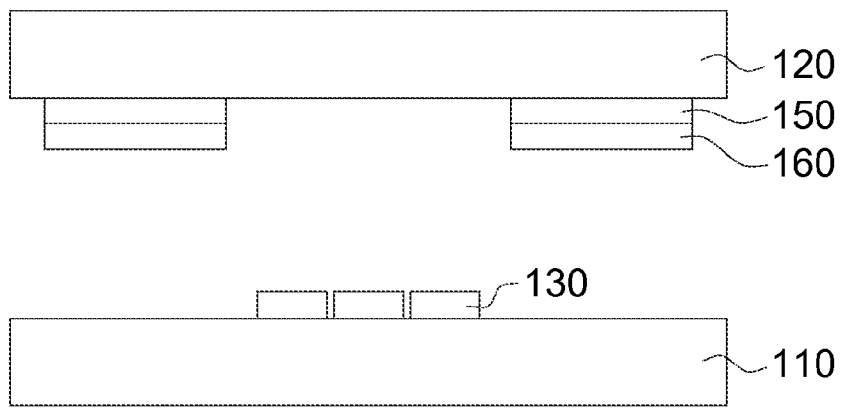

Referring to FIG. 3B, the metal layer 150 may be formed on the second substrate 120, optionally. In the embodiment, the metal layer 150 is formed, for example, between the frit layer, which will be formed in the following process, and the second substrate 120.

Referring to FIG. 3B, the metal nitride layer 160 may be formed on the metal layer 150, optionally. In the embodiment, the metal nitride layer 160 is formed, for example, between the frit layer 140, which will be formed in the following process, and the metal layer 150.

Figure 3C:
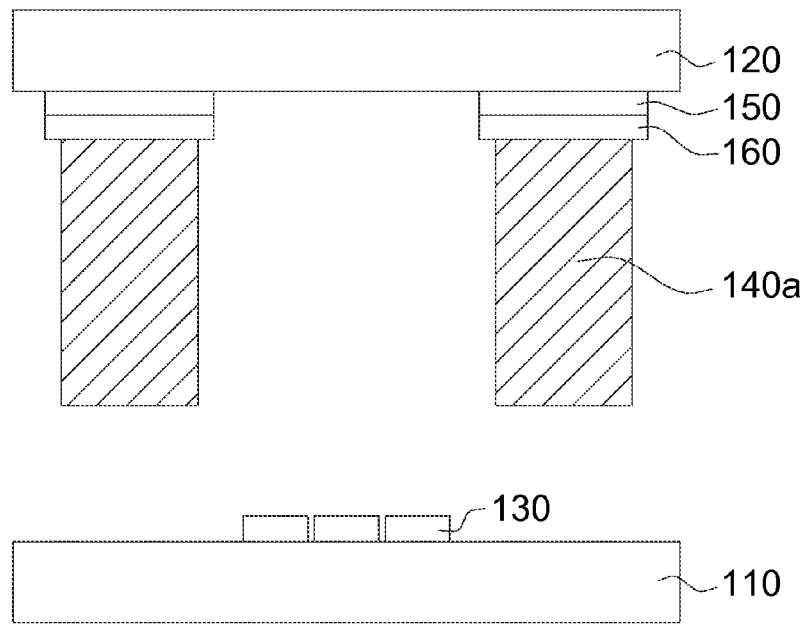
Figure 3D:
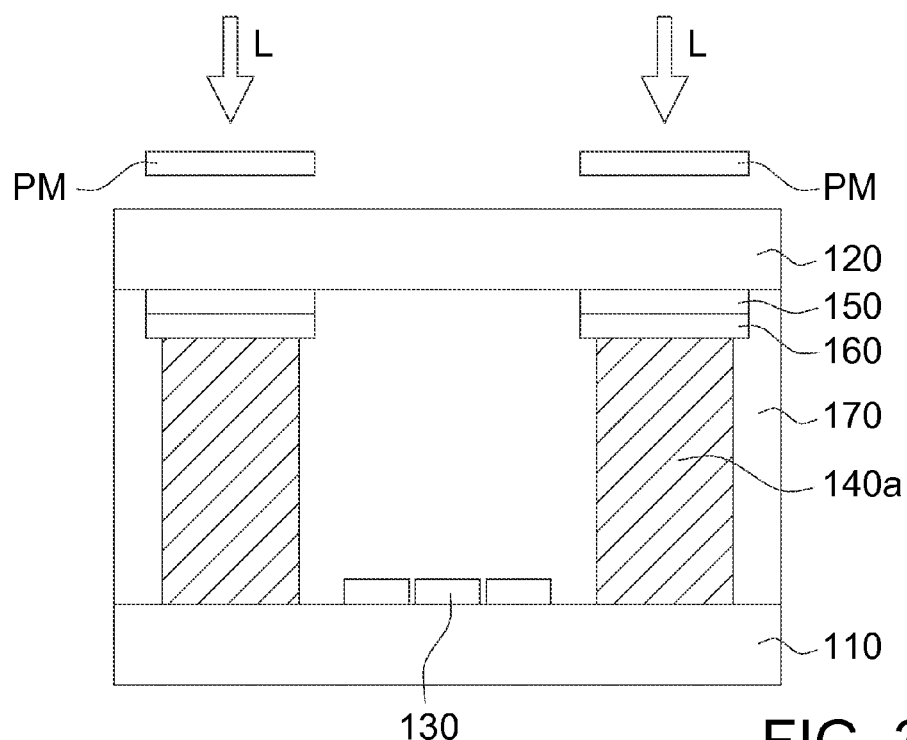
Figure 3E:
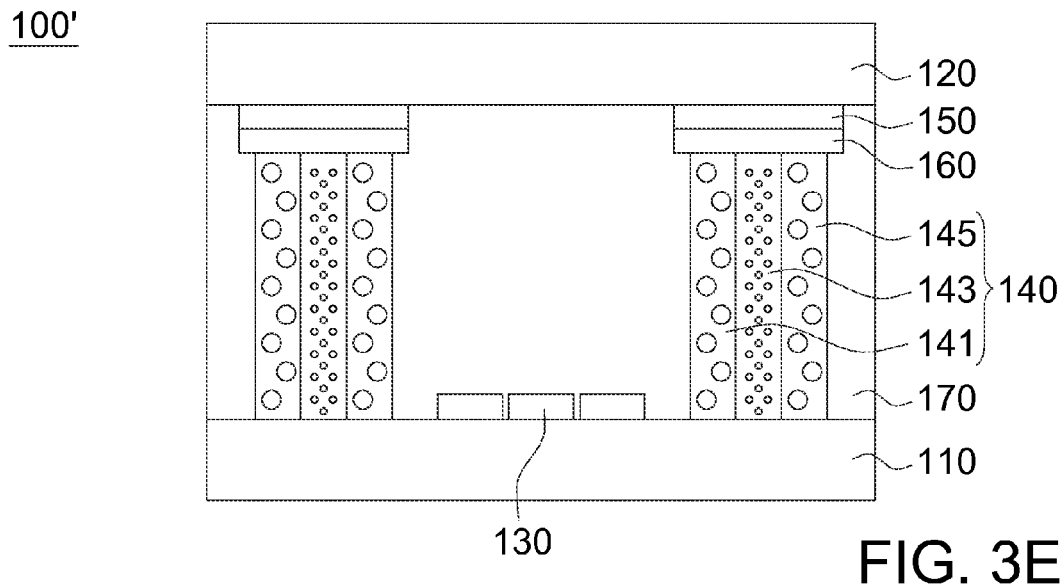

Referring to FIGS. 3C-3E, the frit layer 140 is formed for adhering the first substrate 110 and the second substrate 120 to each other. As shown in FIG. 3E, the manufacturing method of forming the frit layer 140 includes, for example: forming the first porous region 141, forming the second porous region 143 adjacent to the first porous region 141, and forming the third porous region 145 adjacent to the second porous region 143, the second porous region 143 being located between the first porous region 141 and the third porous region 145. The first porous region 141 has the first pores 141a with diameters of larger than or equal to 4 μm and smaller than or equal to 15 μm. The second porous region 143 has the second pores 143a with diameters of larger than or equal to 0.2 μm and smaller than or equal to 4 μm. The third porous region 145 has the third pores 145a with diameters of larger than or equal to 4 μm and smaller than or equal to 15 μm.

In an embodiment, the steps of forming the first porous region 141, forming the second porous region 143, and forming the third porous region 145 are carried out simultaneously. In the embodiment, the frit layer 140 is formed, for example, between the first substrate 110 and the second substrate 120 and surrounds the organic light emitting diodes 130.

In the embodiment, the manufacturing method of forming the frit layer 140 includes such as the following steps. As shown in FIG. 3C, a frit material layer 140a is formed on the second substrate 120. In an embodiment, the frit material layer 140a is formed on the metal layer 150 and the metal nitride layer 160. Next, the frit material layer 140a is preheated. In the embodiment, the frit material layer 140a is preheated at a temperature of, for example, 460-500° C. The frit material layer 140a is preheated to be coagulated on the surface of the second substrate 120, such that the frit material layer 140a will not overflow when the second substrate 120 is flipped over in the following assembling process.

Next, as shown in FIG. 3D, the first substrate 110 and the second substrate 120 are assembled, and the frit material layer 140a is heated to form the frit layer 140 adhering the first substrate 110 and the second substrate 120 to each other. In the embodiment, the frit material layer 140a is heated by, such as, the laser beam L to form the frit layer 140. In the embodiment, the frit material layer 140a is heated by the laser beam L at a temperature higher than the preheating temperature. In the embodiment, the frit material layer 140a comprises a silicon-containing material, and the first substrate 110 and the second substrate 120 are glass substrates. When the heating treatment is carried out by the laser beam L, the homogeneity of the materials of the frit material layer 140a, the first substrate 110, and the second substrate 120 causes the three layers turn into a melting state as heated, and therefore, the frit material layer 140a perfectly adheres the first substrate 110 and the second substrate 120 to each other, and the whole structure after adhering has excellent moisture resistance.

In the embodiment, the energy of the laser beam L is higher when the laser beam L is irradiated on the first porous region 141 and on the third porous region 145, and the energy of the laser beam L is lower when the laser beam L is irradiated on the second porous region 143, such that the average pore size of the pores of the first porous region 141 and the third porous region 145 is larger, and the average pore size of the pores of the second porous region 143 is smaller. In an embodiment, the laser beam L may include a plurality of laser pulses continuously irradiated on the frit material layer 140a.

In an embodiment, as shown in FIG. 3D, the frit material layer 140a may be heated by the laser beam L passing through a patterned mask PM to form the first porous region 141, the second porous region 143, and the third porous region 145, as shown in FIG. 3D. In an embodiment, the patterned mask PM may have a plurality of slits (referring to FIG. 4), and the laser beam L passes the slits to heat the frit material layer 140a.

Figure 4:
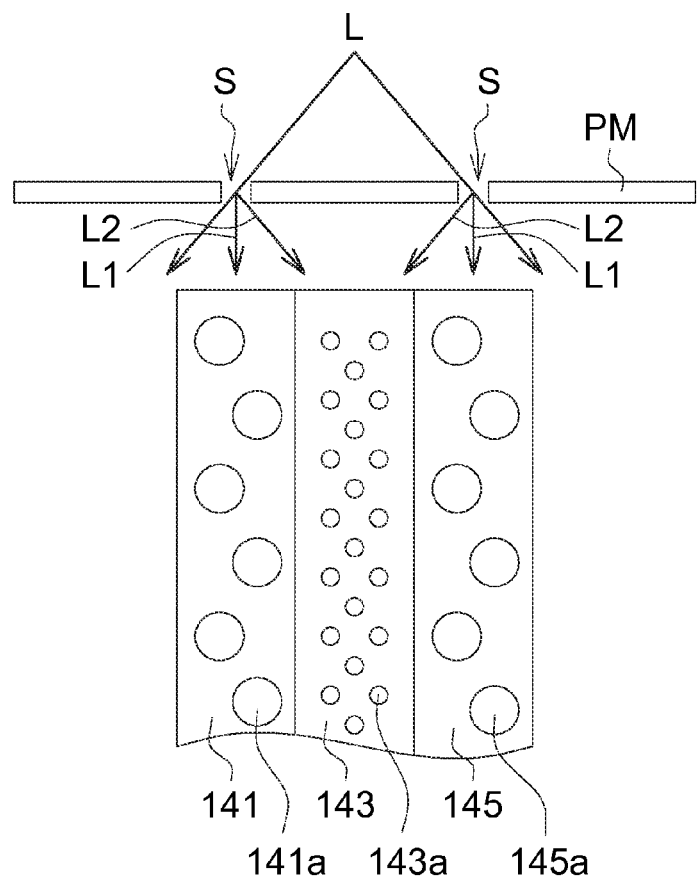
FIG. 4 shows a partial schematic diagram of a laser beam passing through a patterned mask for forming a frit layer according to an embodiment of the present invention.

FIG. 4 shows a partial schematic diagram of a laser beam passing through a patterned mask for forming a frit layer according to an embodiment of the present invention. As shown in FIG. 4, each patterned mask PM has, for example, two slits S, and the locations of the two slits S are corresponding to the predetermined positions of the first porous region 141 and the second porous region 143, respectively. The laser beam L passes through the two slits S and is divided into a plurality of laser beams heating different regions of the frit material layer 140a, respectively, to form the frit layer 140. As shown in FIG. 4, the laser beam L1 irradiates on the first porous region 141 and the third porous region 145. Since the travelling path of the laser beam L1 is shorter, making the irradiation energy larger, and the temperature of the laser sintering is higher, as such, the pores of the first porous region 141 and the third porous region 145 have a larger size. In contrast, the laser beam L2 irradiates on the second porous region 143. Since the travelling path of the laser beam L2 is longer, making the irradiation energy smaller, and the temperature of the laser sintering is lower, as such, the pores of the second porous region 143 have a smaller size.

Next, as shown in FIG. 3E, the encapsulation layer 170 may be formed between the first substrate 110 and the second substrate 120, optionally. The encapsulation layer 170 covers the frit layer 140. As such, the organic light emitting diode display 100' as shown in FIG. 3E is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display, comprising:
   a first substrate, a second substrate, a plurality of organic light emitting diodes disposed between the first substrate and the second substrate, wherein the first substrate comprises a surface; and
   a frit layer disposed between the first substrate and the second substrate, wherein the plurality of light emitting diodes and the frit layer are in direct contact with the surface, the frit layer comprises a corner portion in view of a direction perpendicular to the surface, the frit layer comprises a plurality of pores, diameters of the pores are ranging from 0.2 µm to 4 µm, and the corner portion has the pores;
   wherein the frit layer comprises a first porous region, a second porous region, and a third porous region in view of the direction perpendicular to the surface, the second porous region is disposed in the center of the frit layer and between the first porous region and the third porous region, and a ratio of a width of the second porous region to a width of the frit layer is between 25% to 35%;
   wherein a number of the pores corresponding to the second porous region is greater than a number of the pores corresponding to the first porous region, and the number of the pores corresponding to the second porous region is greater than a number of the pores corresponding to the third porous region.

2. The display according to claim 1, wherein a width of the first porous region is the same with a width of the third porous region.

3. The display according to claim 2, wherein the width of the second porous region is the same with the width of the first porous region.

4. The display according to claim 1, wherein the frit layer further comprises a straight portion in view of the direction perpendicular to the surface, the straight portion is adjacent to the corner portion, and a number of the pores corresponding to the corner portion of the frit layer is greater than a number of the pores corresponding to the straight portion of the frit layer.

5. The display according to claim 1, further comprising an encapsulation layer disposed between the first substrate and the second substrate, wherein the encapsulation layer surrounds the frit layer, and the frit layer is disposed between the organic light emitting diodes and the encapsulation layer.

6. The display according to claim 5, further comprising a fan out wire structure disposed between the first substrate and the second substrate, wherein the fan out wire structure electrically connects to the organic light emitting diodes, and the frit layer partially overlaps with the fan out wire structure.

7. The display according to claim 6, further comprising a metal layer disposed between the first substrate and the second substrate, wherein the metal layer is electrically isolated from the fan out wire structure, and the frit layer partially overlaps with the metal layer.

8. The display according to claim 6, wherein the encapsulation layer partially overlaps with the fan out wire structure.

9. The display according to claim 7, wherein the encapsulation layer partially overlaps with the metal layer.

10. The display according to claim 7, wherein the fan out wire structure and the metal layer are the same layer.

11. A manufacturing method of an organic light emitting diode display, comprising:
    providing a first substrate and a second substrate, the first substrate comprising a surface;
    forming a plurality of organic light emitting diodes in direct contact with the surface between the first substrate and the second substrate; and
    forming a frit layer in direct contact with the surface between the first substrate and the second substrate, wherein the frit layer comprises a corner portion in view of a direction perpendicular to the surface, the frit layer comprises a plurality of pores, diameters of the pores are ranging from 0.2 µm to 4 µm, and the corner portion has the pores;
    wherein the frit layer comprises a first porous region, a second porous region, and a third porous region in view of the direction perpendicular to the surface, the second porous region is disposed in the center of the frit layer and between the first porous region and the third porous region, and a ratio of a width of the second porous region to a width of the frit layer is between 25% to 35%;
    wherein a number of the pores corresponding to the second porous region is greater than a number of the pores corresponding to the first porous region, and the number of the pores corresponding to the second porous region is greater than a number of the pores corresponding to the third porous region.

12. The manufacturing method of the organic light emitting diode display according to claim 11, wherein a width of the first porous region is the same with a width of the third porous region.

13. The manufacturing method of the organic light emitting diode display according to claim 12, wherein the width of the second porous region is the same with the width of the first porous region.

14. The manufacturing method of the organic light emitting diode display according to claim 11, wherein forming the frit layer comprises:
    forming a frit material layer on the second substrate;
    preheating the frit material layer;
    assembling the first substrate and the second substrate; and heating the frit material layer for forming the frit layer adhering the first substrate and the second substrate to each other.

15. The manufacturing method of the organic light emitting diode display according to claim 14, wherein the frit material layer is preheated at a temperature of 460-500° C.

16. The manufacturing method of the organic light emitting diode display according to claim 14, wherein the frit material layer is heated by a laser beam for forming the frit layer.

17. The manufacturing method of the organic light emitting diode display according to claim 16, wherein the frit material layer is heated by the laser beam passing through a patterned mask for forming the first porous region, the second porous region, and the third porous region.

18. The manufacturing method of the organic light emitting diode display according to claim 11, further comprising forming an encapsulation layer, wherein the encapsulation layer surrounds the frit layer, and the frit layer is disposed between the organic light emitting diodes and the encapsulation layer.

* * * * *